US010197655B2

United States Patent
Umeda et al.

(10) Patent No.: US 10,197,655 B2
(45) Date of Patent: Feb. 5, 2019

(54) MAGNETIC RESONANCE IMAGING APPARATUS AND MAGNETIC RESONANCE IMAGING METHOD

(71) Applicant: TOSHIBA MEDICAL SYSTEMS CORPORATION, Otawara-shi, Tochigi (JP)

(72) Inventors: Masaaki Umeda, Tochigi (JP); Naotaka Sakashita, Kyoto (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1006 days.

(21) Appl. No.: 14/640,725

(22) Filed: Mar. 6, 2015

(65) Prior Publication Data

US 2015/0185303 A1 Jul. 2, 2015

Related U.S. Application Data

(63) Continuation of application No. PCT/JP2013/073507, filed on Sep. 2, 2013.

(30) Foreign Application Priority Data

Sep. 11, 2012 (JP) ................. 2012-199826

(51) Int. Cl.
  *G01R 33/48* (2006.01)
  *G01R 33/56* (2006.01)
  (Continued)

(52) U.S. Cl.
  CPC ....... *G01R 33/4818* (2013.01); *G01R 33/482* (2013.01); *G01R 33/5608* (2013.01); *G01R 33/565* (2013.01); *G01R 33/5617* (2013.01)

(58) Field of Classification Search
  CPC .............. G01R 33/482; G01R 33/4818; G01R 33/5617; G01R 33/565; G01R 33/5608
  See application file for complete search history.

(56) References Cited

U.S. PATENT DOCUMENTS

| 5,357,200 A | 10/1994 | Kajiyama |
| 6,380,739 B1 | 4/2002 | Machida |

(Continued)

FOREIGN PATENT DOCUMENTS

| JP | 1993-329127 | 12/1993 |
| JP | 2001-070283 | 3/2001 |

(Continued)

OTHER PUBLICATIONS

International Search Report for PCT/JP2013/073507 dated Dec. 3, 2013, 2 pages.

(Continued)

*Primary Examiner* — Dixomara Vargas
(74) *Attorney, Agent, or Firm* — Nixon & Vanderhye P.C.

(57) ABSTRACT

According to one embodiment, a magnetic resonance imaging apparatus includes a data acquisition unit and an image generation unit. The data acquisition unit is configured to acquire magnetic resonance signals from an object in a data acquisition order having a first regularity and a data acquisition order having a second regularity different from the first regularity. The magnetic resonance signals correspond to a sampling region asymmetric in a wave number direction in a k-space. The image generation unit is configured to generate magnetic resonance image data by data processing including image reconstruction processing based on the magnetic resonance signals and a signal filling to a non-sampling region using a phase conjugate symmetry in the k-space.

12 Claims, 6 Drawing Sheets

(51) Int. Cl.
  *G01R 33/561* (2006.01)
  *G01R 33/565* (2006.01)

(56) References Cited

U.S. PATENT DOCUMENTS

| | | |
|---|---|---|
| 6,400,151 B1 | 6/2002 | Haase et al. |
| 2008/0161678 A1 | 7/2008 | Miyazaki et al. |
| 2009/0302840 A1 | 12/2009 | Fung et al. |
| 2010/0222666 A1 | 9/2010 | Foo |
| 2010/0260403 A1 | 10/2010 | Takizawa et al. |

FOREIGN PATENT DOCUMENTS

| | | |
|---|---|---|
| JP | 2004-321791 | 11/2004 |
| JP | 2012-070939 | 4/2012 |
| WO | 2009/081785 A1 | 7/2009 |

OTHER PUBLICATIONS

Written Opinion of the International Searching Authority (non-English) dated Dec. 3, 2013, 5 pages.
Takei et al., "Breathhold inhance inflow IR (BH-IFIR) with a novel 3D recessed fan beam view ordering", Proceedings of ISMRM-ESMRMB Joint Annual Meeting, 2010, 1 page.
Japanese office action dated Jul. 25, 2017, in Patent Application No. 2013-182629.
Final Japanese office action dated Oct. 17, 2017, in Patent Application No. 2013-182629.
CN Office Action dated Jun. 24, 2015 in in CN 201380002711.6.
Notification of Transmittal of Translation of the International Preliminary Report on Patentability in PCT/JP2013/073507 dated Mar. 26, 2015.

(A) FIRST SEQUENCE (CONVENTIONAL)

(B) SECOND SEQUENCE (UPDATE)

MAGNETIC RESONANCE IMAGING APPARATUS AND MAGNETIC RESONANCE IMAGING METHOD

CROSS REFERENCES TO RELATED APPLICATIONS

This is a continuation of Application PCT/JP2013/73507, filed on Sep. 2, 2013.

This application is based upon and claims the benefit of priority from Japanese Patent Application No. 2012-199826, filed on Sep. 11, 2012; the entire contents of which are incorporated herein by reference.

FIELD

Embodiments described herein relate generally to an MRI (magnetic resonance imaging) apparatus and a magnetic resonance imaging method.

BACKGROUND

The MRI apparatus is an imaging diagnostic apparatus which magnetically excites nuclear spins of an object set in a static magnetic field with RF (radio frequency) signals having the Larmor frequency and reconstructs an image based on MR (magnetic resonance) signals generated due to the excitation.

As one of imaging methods for MRI apparatuses, the AFI (Asymmetric Fourier Imaging) method is known. In the AFI method, data are sampled so as to be asymmetric in the wave number direction in the k-space. Then, a phase correction is performed using a phase distribution estimated based on the sampled self data. After the phase correction, image data are reconstructed. The AFI method enables to generate image data equivalent to image data generated from data symmetrically sampled in the k-space.

For this reason, according to the AFI method, reduction of an echo time (TE) is possible when a direction in which k-space data are asymmetric is a readout direction of the k-space data. On the other hand, when a direction in which k-space data are asymmetric is an encode direction, an imaging time can be reduced. As a pulse sequence used for the AFI method, the series of an FSE (fast spin echo) sequence, such as a FASE (fast advanced spin echo or fast asymmetric spin echo) sequence, can be mentioned.

PRIOR TECHNICAL LITERATURE

[Patent literature 1] JPA 2010-217981

However, when a TE is short and the number of shots is small in the FASE method, the number of MR signals filling the k-space becomes small. For this reason, estimating phases with a favorable accuracy becomes difficult in the AFI processing. Moreover, a large difference in intensity may arise between signals at the both ends in a phase encode (PE) direction and may possibly cause image quality deterioration.

Accordingly, it is an object of the present invention to provide a magnetic resonance imaging apparatus and a magnetic resonance imaging method which make it possible to perform imaging by the AFI method with a more improved image quality.

DETAILED DESCRIPTION

In general, according to one embodiment, a magnetic resonance imaging apparatus includes a data acquisition unit and an image generation unit. The data acquisition unit is configured to acquire magnetic resonance signals from an object in a data acquisition order having a first regularity and a data acquisition order having a second regularity different from the first regularity. The magnetic resonance signals correspond to a sampling region asymmetric in a wave number direction in a k-space. The image generation unit is configured to generate magnetic resonance image data by data processing including image reconstruction processing based on the magnetic resonance signals and a signal filling to a non-sampling region using a phase conjugate symmetry in the k-space.

Further, according to another embodiment, a magnetic resonance imaging method includes: acquiring magnetic resonance signals from an object in a data acquisition order having a first regularity and a data acquisition order having a second regularity different from the first regularity; and generating magnetic resonance image data by data processing including image reconstruction processing based on the magnetic resonance signals and a signal filling to a non-sampling region using a phase conjugate symmetry in the k-space. The magnetic resonance signals correspond to a sampling region asymmetric in a wave number direction in a k-space.

A magnetic resonance imaging apparatus and a magnetic resonance imaging method according to embodiments of the present invention will be described with reference to the accompanying drawings.

Figure 1:
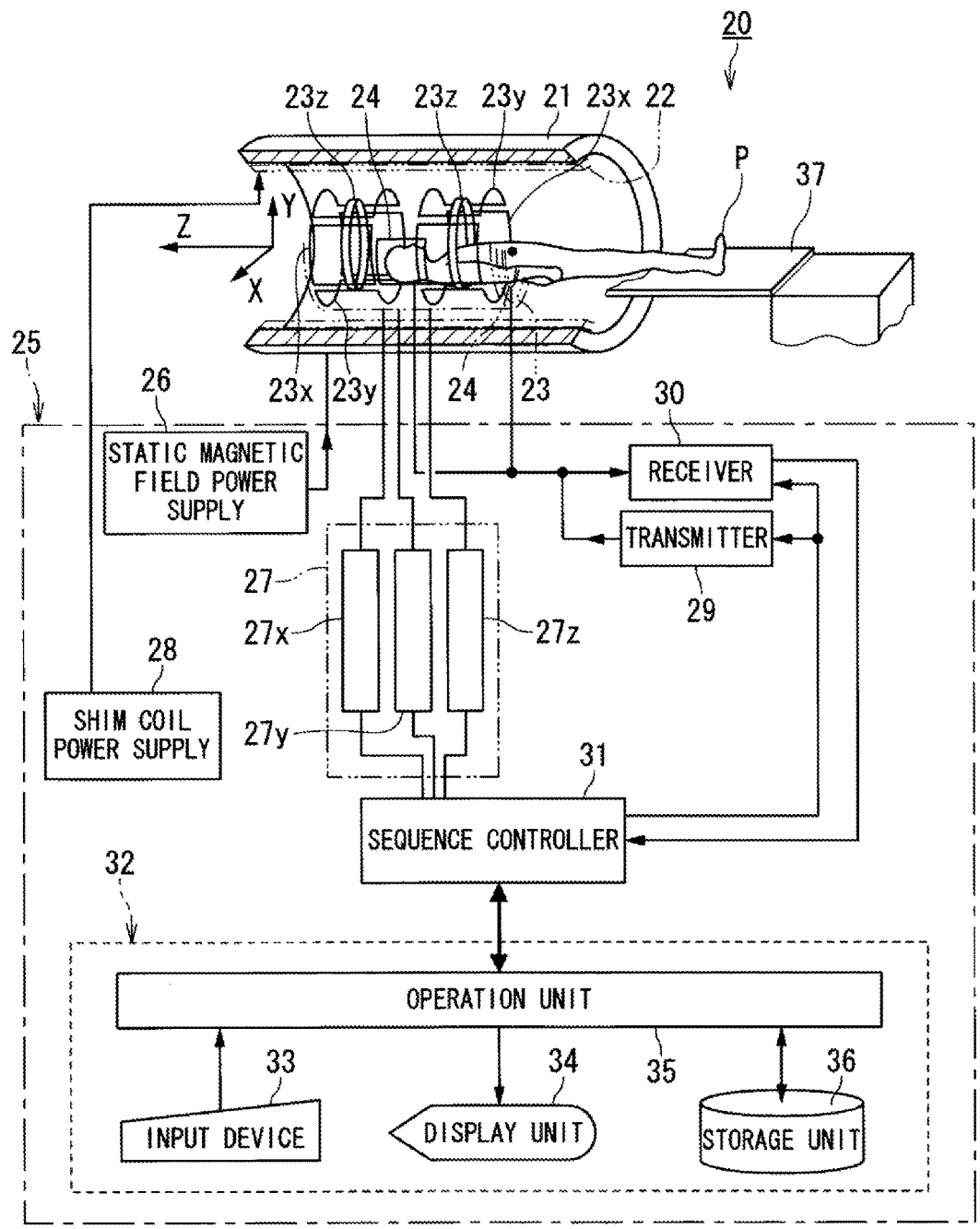
FIG. 1 is a block diagram showing a magnetic resonance imaging apparatus according to an embodiment of the present invention.

FIG. 1 is a block diagram showing a magnetic resonance imaging apparatus according to an embodiment of the present invention.

A magnetic resonance imaging apparatus 20 includes a cylinder-shaped static field magnet 21, a shim coil 22, a gradient coil 23 and RF coils 24. The static field magnet 21 generates a static magnetic field. The shim coil 22 is arranged inside the static field magnet 21.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, an operation unit 35 and a storage unit 36.

The static field magnet 21 communicates with the static magnetic field power supply 26. The static magnetic field power supply 26 supplies electric current to the static field magnet 21 to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z, which is cylinder-shaped, is arranged inside the static field magnet 21. The gradient coil 23 has also a bed 37 in the area formed inside it which is an imaging area. The bed 37 supports an object P. The RF coils 24 include a WBC (whole body coil), which is built in a gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coils 24 communicate with the transmitter 29 and/or the receiver 30. The transmission RF coil 24 transmits RF signals given from the transmitter 29 to the object P. The reception RF coil 24 receives MR signals generated due to nuclear spins inside the object P which are excited by the RF signals to give to the receiver 30.

The sequence controller 31 of the control system 25 communicates with the gradient power supply 27, the transmitter 29 and the receiver 30. The sequence controller 31 stores sequence information describing control information needed in order to drive the gradient power supply 27, the transmitter 29 and the receiver 30, and generates gradient magnetic fields Gx, Gy and Gz in the X, Y and Z directions and RF signals by driving the gradient power supply 27, the transmitter 29 and the receiver 30 according to a predetermined stored sequence. The above-described control information includes motion control information, such as intensities, application durations and application timings of electric current pulses which should be applied to the gradient power supply 27.

The sequence controller 31 is also configured to give raw data to the computer 32. The raw data, which are complex-valued data, are generated by the receiver 30 performing detection and A/D (analog to digital) conversion of MR signals.

The transmitter 29 gives RF signals to the RF coil 24 in accordance with control information provided from the sequence controller 31. Meanwhile, the receiver 30 performs detection, necessary signal processing and A/D conversion of MR signals given from the RF coils 24 to generate raw data which are digitized complex-valued data. The generated raw data are given from the receiver 30 to the sequence controller 31.

The computer 32 has various functions by the operation unit 35 executing programs stored in the storage unit 36 of the computer 32. Alternatively, specific circuits having various functions may be provided to the magnetic resonance imaging apparatus 20, instead of at least a part of the computer programs.

Figure 2:
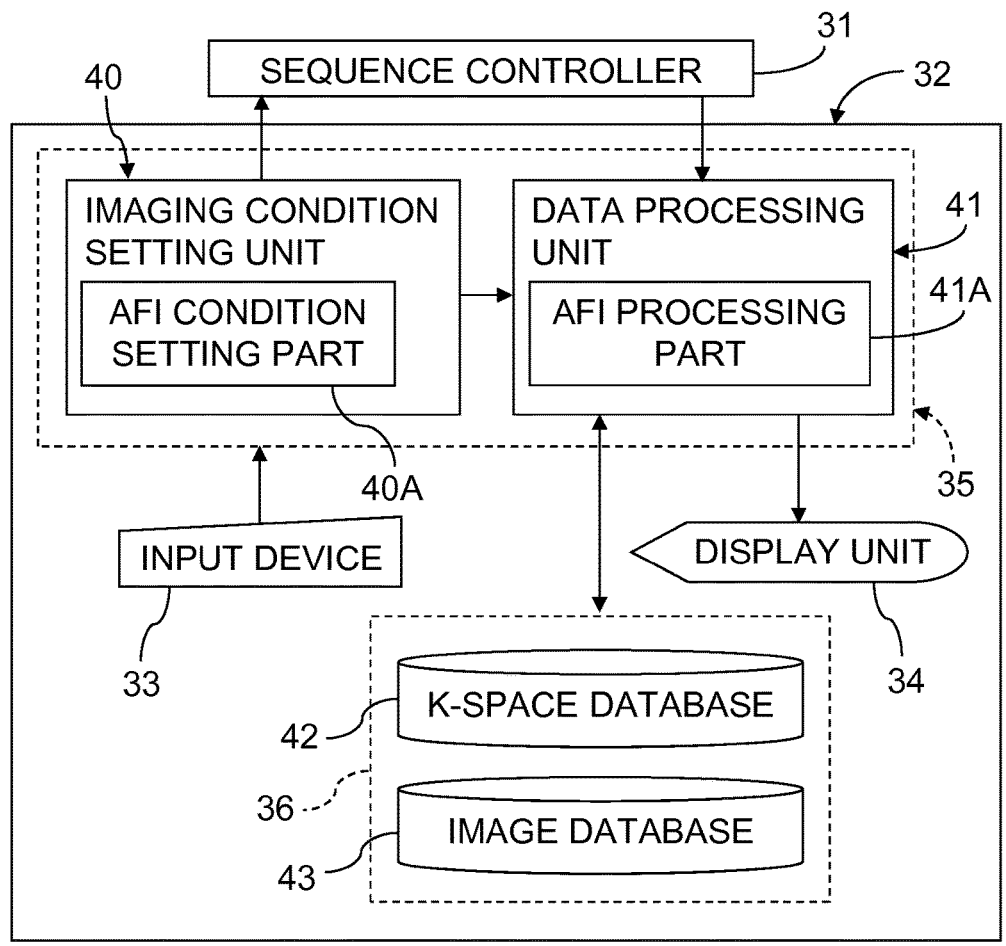
FIG. 2 is a functional block diagram of the computer shown in FIG. 1.

FIG. 2 is a functional block diagram of the computer 32 shown in FIG. 1.

The operation unit 35 of the computer 32 functions as an imaging condition setting unit 40 and a data processing unit 41 by executing the program stored in the storage unit 36. The imaging condition setting unit 40 includes an AFI condition setting part 40A while the data processing unit 41 includes an AFI processing part 41A. Moreover, the storage unit 36 functions as a k-space database 42 and an image database 43.

The imaging condition setting unit 40 has a function to set imaging conditions, including a pulse sequence, based on directions from the input device 33 and output the set imaging conditions to the sequence controller 31 to control the drive of the sequence controller 31.

The AFI condition setting part 40A is configured to be able to set imaging conditions for AFI which acquires MR data, corresponding to a sampling region asymmetric in the wave number direction in the k-space, from an object P. The AFI method is an image reconstruction method to approximately generate image data, which are similar to image data based on symmetrically sampled MR data, based on MR data sampled asymmetrically in the wave number direction in at least one axis direction in a two dimensional (2D) or three dimensional (3D) k-space.

In the AFI condition setting part 40A, a FASE sequence can be set to acquire MR signals, having a required number of signals for the AFI processing, in an order which decreases variation in signal intensity as much as possible, by combining plural regularities each determining an acquisition order of MR signals in a k-space.

Figure 3:
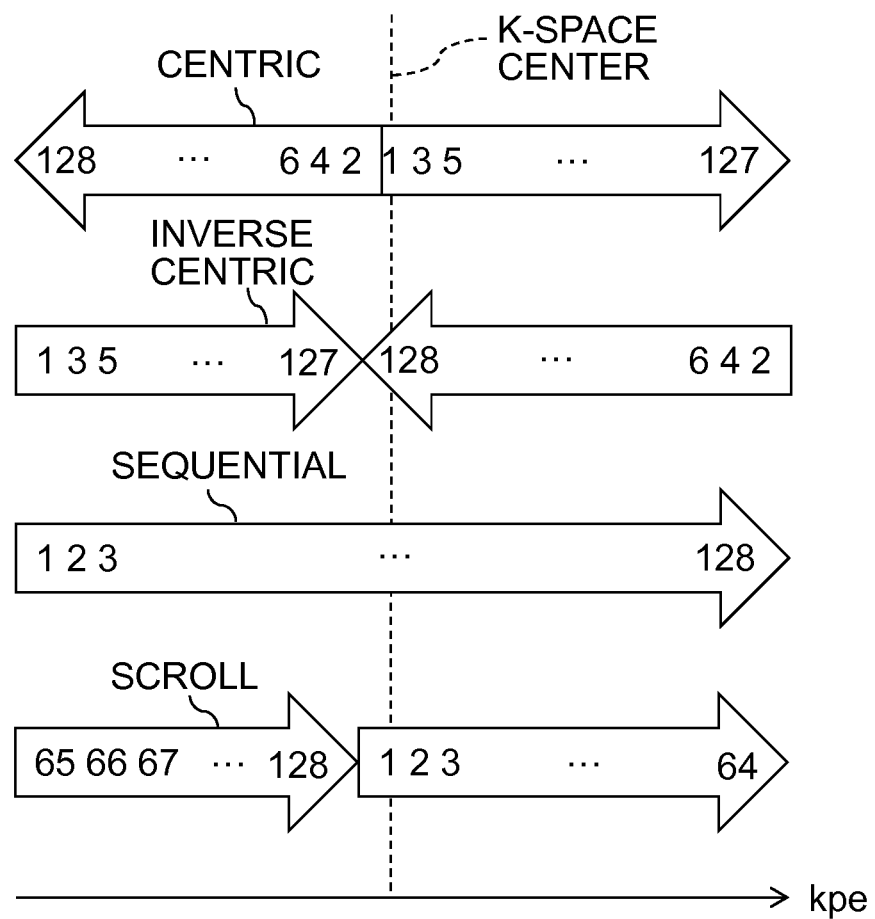
FIG. 3 shows acquisition orders of MR signals in a k-space.

FIG. 3 shows acquisition orders of MR signals in a k-space.

In FIG. 3, a horizontal axis denotes a PE (phase encode) direction kpe in the k-space. Moreover, each arrow shown in FIG. 3 represents a direction of data acquisition of MR signals, and the numbers in each arrow represent data acquisition orders in a case of acquiring 128 MR signals.

As shown in FIG. 3, the centric acquisition, the inverse centric acquisition, the sequential acquisition, and the scroll acquisition are known as regularities to determine acquisition orders of MR signals. The centric acquisition is a data acquisition method for alternately acquiring MR signals, in the positive polarity side and the negative polarity side, from the vicinity of the center, which is the low frequency region, of the k-space toward the high frequency sides of the k-space. On the other hand, the inverse centric acquisition is a data acquisition method for alternately acquiring MR signals, in the positive polarity side and the negative polarity side, from the high frequency sides of the k-space toward the low frequency side of the k-space. The sequential acquisition is a data acquisition method for acquiring MR signals in one direction from one high frequency side in the k-space toward the other high frequency side. The scroll acquisition is a data acquisition method for acquiring MR signals from the vicinity of the center, which is the low frequency region, of the k-space toward one high frequency side of the k-space, and subsequently acquiring MR signals from the other high frequency side toward the low frequency side.

The AFI condition setting part 40A can set imaging conditions for AFI by combining data acquisition methods as mentioned above.

Figure 4:
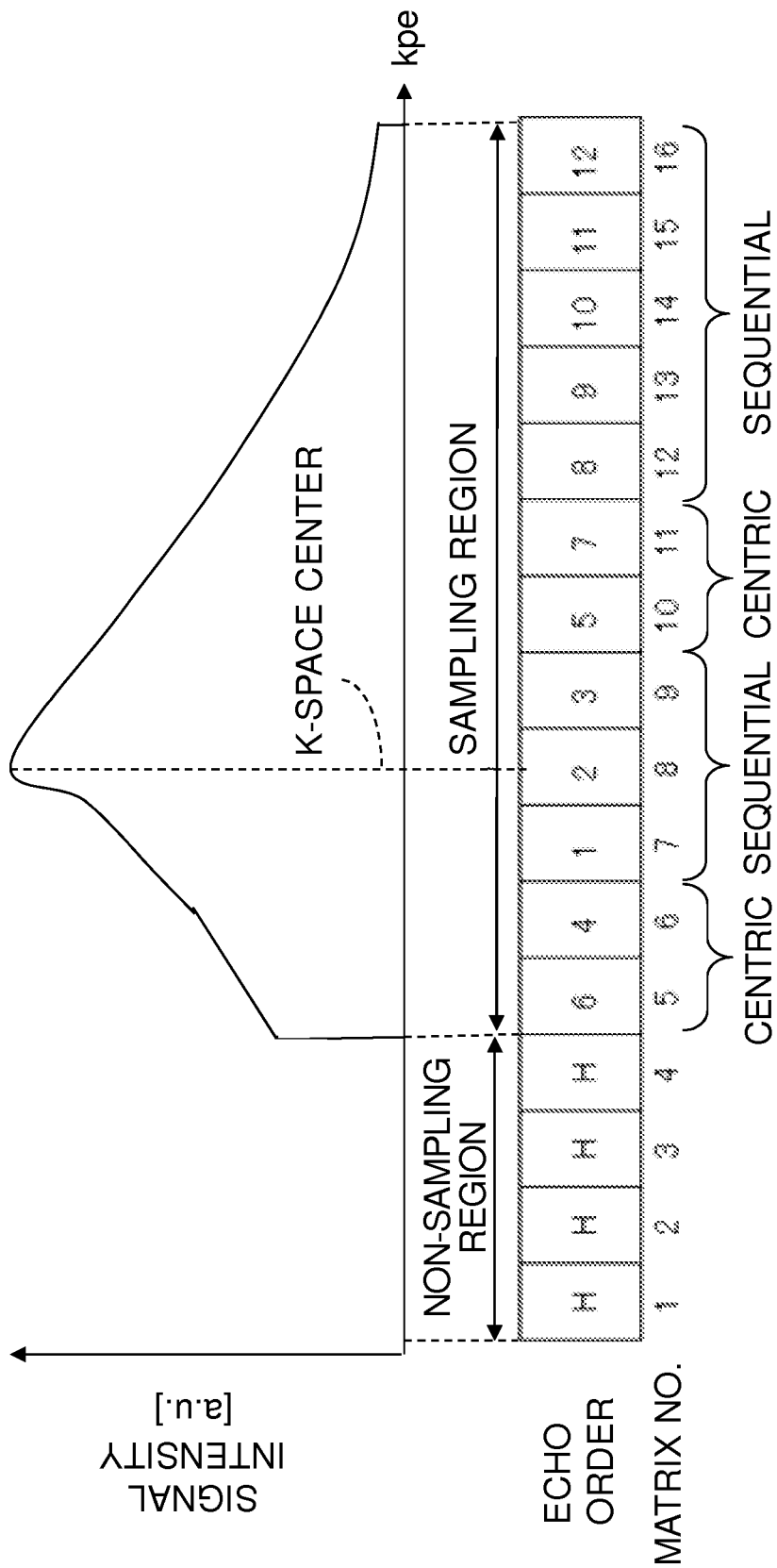
FIG. 4 is a graph showing the first example of data acquisition order for AFI set in the AFI condition setting part shown in FIG. 2.

FIG. 4 is a graph showing the first example of data acquisition order for AFI set in the AFI condition setting part 40A shown in FIG. 2.

In FIG. 4, the horizontal axis denotes a PE direction kpe in the k-space, the vertical axis denotes signal intensities of MR signals expressed by an arbitrary unit, each rectangle frame denotes an MR signal, the number in each rectangle frame denotes an acquisition order, and the number indicated outside each rectangle frame denotes a matrix number corresponding to a frequency in the PE direction kpe, respectively.

FIG. 4 shows a data acquisition order of MR signals acquired by an FSE sequence, whose number of shots of RF excitation pulses is one, in the case that a matrix size in a PE direction kpe is 16 for the purpose of simple explanation. These conditions are applied to the following figures similarly.

In the AFI method, MR signals corresponding to a sampling region asymmetric in a wave number direction in a k-space are acquired as MR data from an object P, as exemplified in FIG. 4. Subsequently, signal filling to a non-sampling region is performed using phase conjugate symmetry in the k-space. Note that, the MR data corresponding to frequencies each written as H represent data filled by not the data acquisition but the AFI processing.

In the data acquisition by the AFI method as mentioned above, data acquisition conditions to acquire the MR signals with changing a regularity in data acquisition order can be set so that the respective MR signals can be acquired in an order in which variations in signal intensities become as small as possible. That is, data acquisition conditions can be set so that plural MR signals corresponding to an asymmetric sampling region in a wave number direction in a k-space can be acquired from an object P in a data acquisition order having the first regularity and in another data acquisition order having the second regularity different from the first regularity.

Specifically, a pulse sequence, such as an FSE sequence, can be set by combining different data acquisition methods, such as the sequential acquisition to perform a data acquisition in one direction in a k-space as shown in FIG. 3, the centric acquisition to acquire MR signals alternately in the positive polarity side and the negative polarity side in a k-space from the low frequency side toward the high frequency sides, and the inverse centric acquisition to acquire MR signals alternately in the positive polarity side and the negative polarity side in a k-space from the high frequency sides toward the low frequency side.

In the example shown in FIG. 4, after the acquisition of the first MR signal train, in the low frequency side, including an MR signal corresponding to the center of the k-space, by the sequential acquisition, the second MR signal train in the positive polarity side and the negative polarity side in a higher frequency side than the first MR signal train are acquired by the centric acquisition. Furthermore, after the acquisition of the second MR signal train, the third MR signal train in the positive polarity side in a further higher frequency side than the second MR signal train are acquired by the sequential acquisition. That is, in the example shown in FIG. 4, the sequential acquisition is performed as a data acquisition by a data acquisition order having the first regularity while the centric acquisition is performed as a data acquisition by a data acquisition order having the second regularity.

Note that, when the non-sampling region is in the positive polarity side, the polarity of MR signals to be acquired also inverts. In that case, the third MR signal train in the negative polarity side in a higher frequency side than the second MR signal train is acquired by the sequential acquisition.

The data acquisition order shown in FIG. 4 can be described by ranking. Specifically, the MR signals up to the acquisition rank order, which corresponds to the number derived by doubling the acquisition rank order of the MR signal corresponding to the center of the k-space and subsequently subtracting one from the doubled acquisition rank order, are continuously acquired by the sequential acquisition. In the example shown in FIG. 4, the MR signal, whose matrix number is 8, corresponding to the center of the k-space is acquired secondarily. Therefore, up to the third MR signals, whose matrix numbers are 7 to 9, are acquired by the sequential acquisition. In other words, the MR signals whose acquisition rank orders are up to third can be acquired by the sequential acquisition and the secondarily acquired MR signal can be used as the MR signal corresponding to the center of the k-space. However, it is practically appropriate to acquire a signal train consisting of about eight MR echoes by the sequential acquisition.

Next, from the MR signal, acquired next to the MR signal whose acquisition rank order corresponds to the number derived by doubling the acquisition rank order of the MR signal corresponding to the center of the k-space and subsequently subtracting one from the doubled acquisition rank order, up to the MR signal, whose acquisition rank order corresponds to the number derived by adding one to the acquisition rank order of the MR signal in the sampling region at the boundary to the non-sampling region, are acquired by the centric acquisition. In the example shown in FIG. 4, the 4th to 7th MR signals corresponding to the matrix numbers 5, 6, 10, and 11 are acquired by the centric acquisition.

After that, the MR signals in the asymmetric part of the sampling region are continuously acquired by the sequential acquisition. In the example shown in FIG. 4, the MR signals, whose acquisition rank orders are 8th to 12th, corresponding to the matrix numbers 12 to 16 are acquired by the sequential acquisition.

When a regularity in data acquisition order is changed during a data acquisition like this, more MR signals can be acquired with high signal intensities from the symmetric part, in the low frequency side, of the sampling region, as shown in the graph in FIG. 4, compared with the case that the regularity in data acquisition order is not changed. That is, the symmetric sampling region, in the low frequency region, where MR signals can be acquired with high signal intensities can be enlarged.

Furthermore, even in a case of a short TE, it is possible to secure the symmetric part of the sampling region sufficiently. Especially, in a case that MR signals are acquired with a TE not more than four times an ETS (echo train spacing), i.e. in a case of such a short TE satisfying the condition of TE≤4ETS, remarkable effects can be attained. For example, when ETS=5 [ms], the symmetric part of the sampling region can be secured favorably in the condition of TE≤20 [ms].

In addition, it becomes possible to acquire an MR signal train whose variation in signal intensity is small totally and which changes smoothly in the PE direction. For this reason, phases can be estimated with a favorable accuracy in the AFI processing. As a result, increase of ghosts can be avoided and MR images can be acquired with a high quality.

The acquisition conditions of the MR signal train exemplified in FIG. 4 can be set as new imaging conditions. Alternatively, the acquisition conditions can also be set based on the conventional acquisition conditions which have a constant regularity in data acquisition order. For that purpose, the AFI condition setting part 40A has a function as a user interface for generating the second pulse sequence, whose regularity in data acquisition order changes, based on the first pulse sequence for acquiring an MR signal train with a constant regularity in data acquisition order. Specifically, a setting screen for generating the second pulse sequence for AFI, based on the first pulse sequence for AFI, can be displayed on the display unit 34.

Figure 5:
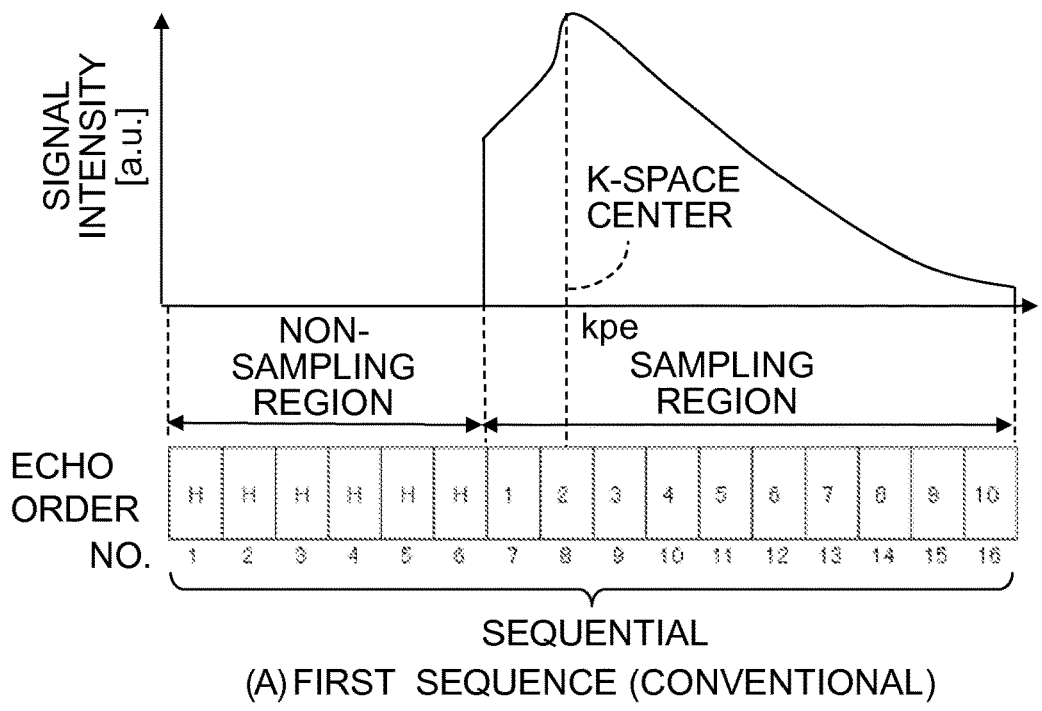
FIG. 5 shows a method of setting a data acquisition order shown in FIG. 4, based on a conventional data acquisition order.
Figure 5:
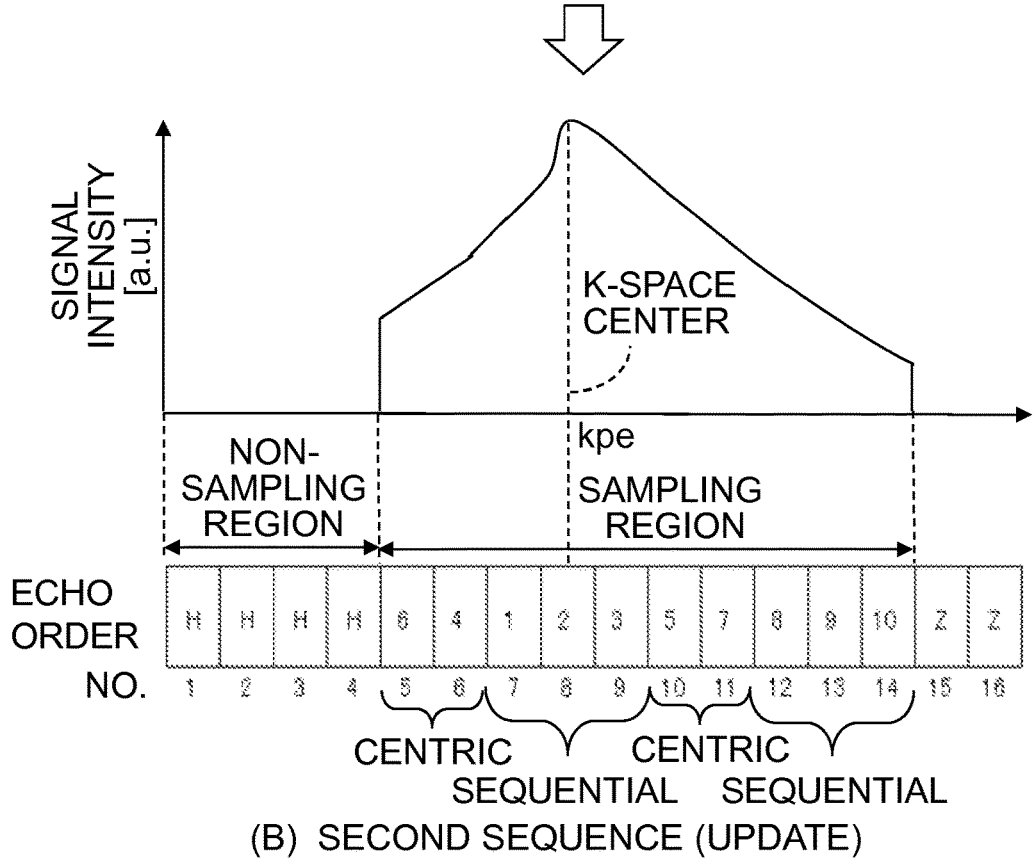

FIG. 5 shows a method of setting a data acquisition order shown in FIG. 4, based on a conventional data acquisition order.

In (A) and (B) of FIG. 5, each horizontal axis denotes a PE direction kpe in the k-space, each vertical axis denotes signal intensities of MR signals expressed by an arbitrary unit, each rectangle frame denotes an MR signal, the number in each rectangle frame denotes an acquisition order, and the number indicated outside each rectangle frame denotes a matrix number corresponding to a frequency in the PE direction kpe, respectively.

FIG. 5 (A) shows the conventional data acquisition order to acquire all the MR signals up to 10th, corresponding to the matrix numbers 7 to 16, by the sequential acquisition. When the MR signal train is acquired continuously, the signal intensity attenuates gradually with time after acquiring the MR signal corresponding to the center of the k-space at a TE. For this reason, all the MR signals are continuously acquired by the sequential acquisition conventionally so that differences in intensities of the MR signals become small in the k-space. That is, the MR signal train is acquired in one direction in the k-space.

However, in a case of a short TE, such as a TE≤4ETS, the number of MR signals which can be acquired with a required signal intensity prior to the MR signal corresponding to the center of the k-space is limited. In the example shown in FIG. 5 (A), only one MR signal whose matrix number is 7 is acquired prior to the MR signal corresponding to the center of the k-space. In such a case where the width of the symmetric sampling region cannot be secured enough, an accuracy in phase distribution estimated by the AFI processing becomes insufficient, which may cause image quality deterioration.

Accordingly, after acquiring MR signals near the center of the k-space continuously by the sequential acquisition, the sampling region and the data acquisition order can be changed, as shown in FIG. 4 and FIG. 5 (B), so that MR signals are sampled from the symmetric regions in the k-space by the centric acquisition. As a result, the symmetric part of the sampling region can be enlarged compared to the conventional sampling region shown in FIG. 5 (A).

In other words, in the region where the number of MR signals is smaller when the k-space is divided into the positive polarity side and the negative polarity side by the center line, a sufficient number of MR signals can be increased as acquisition targets from the side close to the center of the k-space, in order to avoid data degradation in the AFI processing. For a specific example, the sampling region can be set as a region derived by adding sampling points of MR signals, by the centric acquisition as shown in FIG. 5 (B), to the low frequency side of the non-sampling region in the case of acquiring MR signals required for generating MR image data by only the sequential acquisition as shown in FIG. 5 (A). In this case, the number of the MR signals which increase as the acquisition targets is limited. For this reason, degradation in image quality, such as an increase of blur, can be reduced sufficiently.

Furthermore, the number of the MR signals to be acquisition targets in the high frequency side may be decreased, as exemplified in FIG. 5 (B). That is, the MR signals to be acquisition targets can be decreased from the region in the side, having a larger number of MR signals, out of the k-space divided into the positive polarity side and the negative polarity side by the center line, from the side farther from the center of the k-space. The signal values at sampling points, excluded from the acquisition targets, in the k-space can be filled by the 0-filling or the like, for example. Note that, each sign Z in FIG. 5 (B) expresses that a signal value is filled by the 0-filling.

By such a reduction in the number of acquisition data in the high frequency side, the data number of the MR signals to be the acquisition targets can be set to be same between the data acquisition conditions shown in FIG. 5 (A) and the data acquisition conditions shown in FIG. 5 (B). That is, the number of MR signals acquired in the low frequency side can be increased without increasing the total data number of MR signals to be acquired.

Surely, the MR signals in the high frequency side may be acquired. In that case, the sampling region is set to a region larger than a sampling region in the case of acquiring MR signals, required for generating MR image data by data processing, by only the sequential acquisition.

Thus, the second pulse sequence as shown in FIG. 4 or FIG. 5 (B) can be generated based on the first pulse sequence as shown in FIG. 5 (A). More specifically, the first pulse sequence for acquiring an MR signal train from a sampling region, whose sampling points in the low frequency side of the k-space are less than those in a sampling region of the second pulse sequence, with keeping a regularity of a data acquisition order constant can be previously set through the setting screen of imaging conditions.

Next, the regularity in the data acquisition order in the first pulse sequence can be changed. In addition, sampling points can be added to the low frequency side in the non-sampling region by the first pulse sequence. Thereby, the second pulse sequence can be generated. In this case, the second pulse sequence can also be generated by changing a part, in the high frequency side, of the sampling region by the first pulse sequence, to a non-sampling region.

Then, the generated second pulse sequence can be set or presented as a sequence for acquiring MR signals through the setting screen of imaging conditions displayed on the display unit 34.

Figure 6:
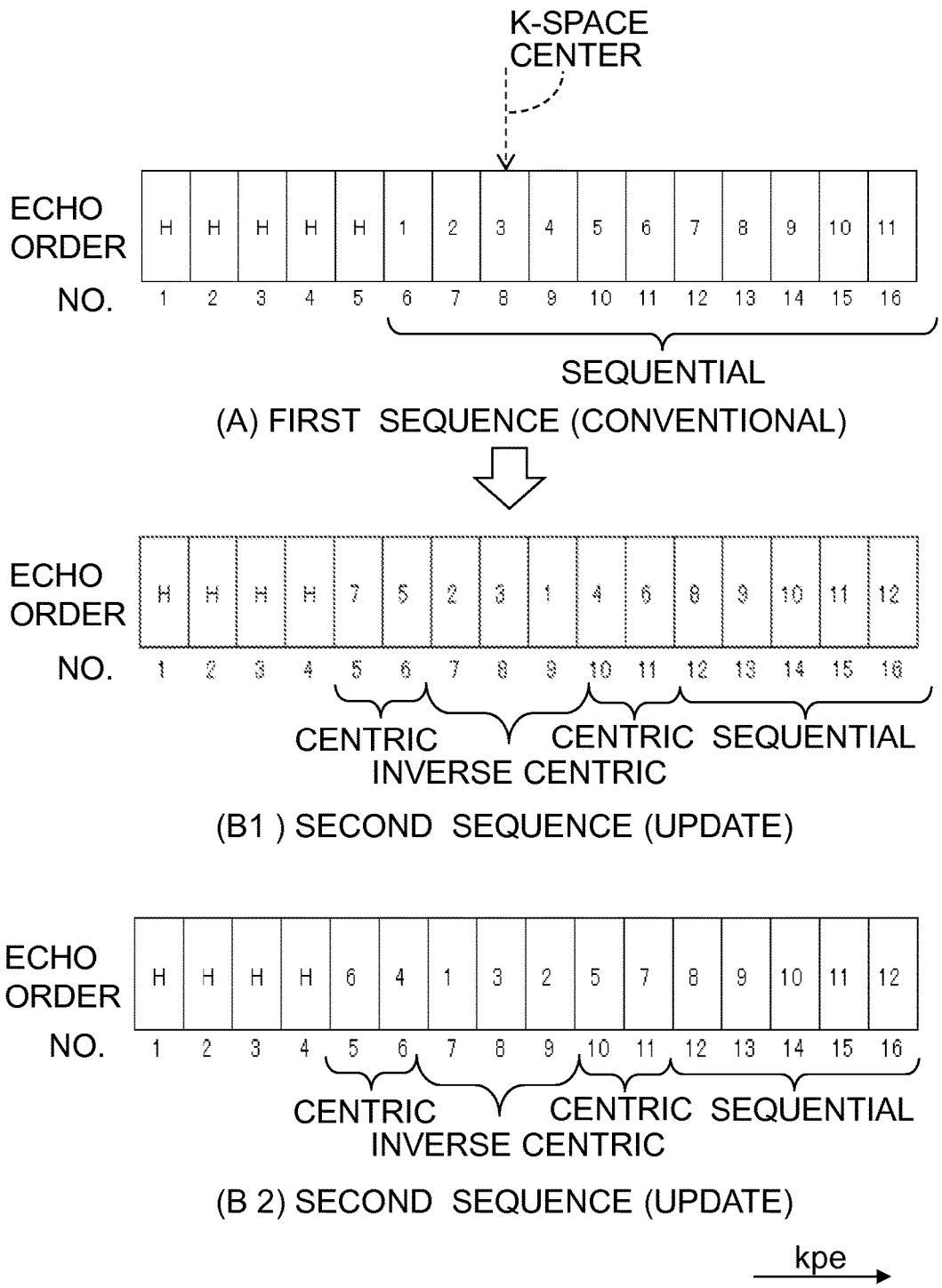
FIG. 6 is a graph showing the second example of data acquisition order for AFI set in the AFI condition setting part shown in FIG. 2.

FIG. 6 is a graph showing the second example of data acquisition order for AFI set in the AFI condition setting part 40A shown in FIG. 2.

In (A), (B1) and (B2) of FIG. 6, the horizontal axis direction denotes a PE direction kpe in the k-space, each rectangle frame denotes an MR signal, the number in each rectangle frame denotes an acquisition order, and the number indicated outside each rectangle frame denotes a matrix number corresponding to a frequency in the PE direction kpe, respectively.

FIG. 6 (A) shows the conventional data acquisition order for acquiring all the MR signals up to 11th corresponding to the matrix numbers 6 to 16 by the sequential acquisition. The data acquisition conditions are set so that the MR signal corresponding to the center of the k-space is acquired thirdly.

In this case, changing the data acquisition order and the sampling region of the first pulse sequence shown in FIG. 6 (A) so as to be one as shown in FIG. 4 or FIG. 5 (B) can generate the second pulse sequence. However, changing the data acquisition order and the sampling region so as to be one as shown in (B1) or (B2) of FIG. 6 can reduce differences in signal intensities in the k-space better.

Specifically, the second pulse sequence can be generated so as to acquire the first MR signal train by the inverse centric acquisition, the second MR signal train by the centric acquisition and the third MR signal train by the sequential acquisition. The first MR signal train is in the low frequency side and includes the MR signal corresponding to the center of the k-space. The second MR signal train is acquired after acquiring the first MR signal train. The second MR signal train includes the MR signals in the positive polarity side and the negative polarity side, in the higher frequency side than the first MR signal train. The third MR signal train is acquired after acquiring the second MR signal train. The third MR signal train includes the MR signals in the positive polarity side or the negative polarity side, in the higher frequency side than the second MR signal train.

In the examples shown in (B1) and (B2) of FIG. 6, the MR signal corresponding to the center of the k-space corresponds to the 3rd acquisition rank order and the matrix number 8. Therefore, up to the thirdly acquired MR signal are acquired by the inverse centric acquisition. In other words, the thirdly acquired MR signal can be used as the MR signal corresponding to the center of the k-space, by performing the inverse centric acquisition.

Next, the 4th MR signal to the 7th MR signal, which corresponds to the sampling point at the boundary to the non-sampling region, are acquired by the centric acquisition. Furthermore, the 8th to 12th MR signals corresponding to the asymmetric part of the sampling region are acquired by the sequential acquisition.

As exemplified by FIG. 4 to FIG. 6, the AFI condition setting part 40A can determine data acquisition conditions so that the second MR signal train including the MR signals in the positive polarity side and the negative polarity side, in the higher frequency side than the first MR signal train in the lower frequency side including the MR signal corresponding to the center of the k-space, is acquired by the centric acquisition which acquires the second MR signal train, alternately between the positive polarity side and the negative polarity side, from the low frequency side toward the high frequency side in the k-space. Thereby, both MR signals, in the low frequency region, required for the AFI processing and signal intensities of the MR signals can be secured.

The data processing unit 41 has a function to acquire MR signals, acquired by an imaging scan in imaging conditions set by the imaging condition setting unit 40, from the sequence controller 31 and to arrange the acquired MR signals in a k-space formed in the k-space database 42, a function to take in k-space data from the k-space database 42 to reconstruct image data by image reconstruction processing including the Fourier transform (FT) of the k-space data, a function to write the image data, acquired by the reconstruction, in the image database 43, a function to perform required image processing of the image data taken from the image database 43 and to display the processed image data on the display unit 34.

The AFI processing part 41A has a function to generate MR image data by the AFI processing of MR data acquired by the AFI method. More specifically, MR image data based on MR signals can be generated by data processing including signal filling to a non-sampling region using phase conjugate symmetry in a k-space and image reconstruction processing based on the MR signals.

Note that, various methods, such as the Margosian method, the FIR (finite impulse response) method, the MoFIR (Modified FIR) method, the POCS (projection on to convex sets) method, and the hybrid method, are proposed as AFI methods. A typical AFI method performs data processing including an estimation of a phase distribution and a phase correction based on the estimated phase distribution. Moreover, k-space data whose part having no data have been subjected to 0-filling is occasionally used as intermediate data, as necessary.

When an imaging scan is performed under an AFI method using the magnetic resonance imaging apparatus 20 having configurations and functions as mentioned above, MR signals required for the AFI processing can be acquired even in a case that a TE is short and the number of shots of RF excitation pulses is small. Therefore, a phase distribution can be estimated with a high accuracy by the AFI processing, and MR image data can be generated with a favorable image quality.

That is, the magnetic resonance imaging apparatus 20 as mentioned above is an apparatus configured to allow devising an acquisition order of MR signals in an AFI method so that both an enough width, in the low frequency side, of a sampling region and continuity in intensities of MR signals acquired from the sampling region can be secured.

For this reason, according to the magnetic resonance imaging apparatus 20, reduction in SNR (signal to noise ratio) can be prevented even in a case where a TE is short and the number of shots is small in an AFI method using an FSE sequence. As a result, errors in the AFI processing can be avoided and MR images can be acquired with a favorable image quality.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:

MRI system components including static and gradient magnetic field generators, at least one radio frequency (RF) coil, RF transmitter and receiver circuits and at least one controlling processor configured to acquire magnetic resonance (MR) signals from an object for a diagnostic MR image in different first and second data acquisition time orders, the MR signals corresponding to a sampling region asymmetric in a phase encoding direction in k-space, said different first and second data acquisition time orders each being one of (a) sequential, (b) centric, (c) inverse, and (d) scroll data acquisition time orders; and generate MRI data by data processing including image reconstruction processing based on the acquired MR signals and generated data filled into a non-sampled region of k-space using phase conjugate symmetry.

2. The magnetic resonance imaging apparatus of claim 1, wherein said at least one processor is configured to acquire a first MR signal train in a low frequency side of k-space and a second MR signal train in a higher frequency side of k-space than the first MR signal train, the first MR signal train including MR signals corresponding to a center of k-space, the second MR signal train including MR signals in a positive polarity side of k-space and a negative polarity side in the higher frequency side of k-space, the second MR signal train being acquired by a centric acquisition which acquires the second MR signal train alternately between the positive polarity side and the negative polarity side of k-space from the low frequency side toward the high frequency side of k-space.

3. The magnetic resonance imaging apparatus of claim 1, wherein said at least one processor is configured to acquire a first MR signal train in a low frequency side of k-space, a second MR signal train in a higher frequency side of k-space than the first MR signal train and a third MR signal train in a further higher frequency side of k-space than the second MR signal train, the first MR signal train including MR signals corresponding to a center of k-space, the second MR signal train including MR signals in a positive polarity side of k-space and a negative polarity side in the higher frequency side of k-space, the third MR signal train including MR signals in a positive polarity side or a negative polarity side in the further higher frequency side of k-space, the first MR signal train being acquired by a first sequential acquisition which acquires the first MR signal train in one direction in k-space, the second MR signal train being acquired after acquiring the first MR signal train, the second MR signal train being acquired by a centric acquisition which acquires the second MR signal train alternately between the positive polarity side of k-space and the negative polarity side in the higher frequency side of k-space from the low frequency side toward the higher frequency side, the third MR signal train being acquired after acquiring the second MR signal train, the third MR signal train being acquired by a second sequential acquisition which acquires the third MR signal train in the one direction or another one direction in k-space.

4. The magnetic resonance imaging apparatus of claim 1, wherein said at least on processor is configured to acquire a first MR signal train in a low frequency side of k-space, a second MR signal train in a higher frequency side than the first MR signal train in k-space and a third MR signal train in a further higher frequency side of k-space than the second MR signal train, the first MR signal train including a MR signal corresponding to a center of k-space, the second MR signal train including MR signals in a positive polarity side of k-space and a negative polarity side in the higher frequency side of k-space, the third MR signal train including MR signals in a positive polarity side or a negative polarity side in the further higher frequency side of k-space, the first MR signal train being acquired by an inverse centric acquisition which acquires the first MR signal train alternately between a positive polarity side and a negative polarity side in the low frequency side from the high frequency side toward the low frequency side in k-space, the second MR signal train being acquired after acquiring the first MR signal train, the second MR signal train being acquired by a centric acquisition which acquires the second MR signal train alternately between the positive polarity side and the negative polarity side in the higher frequency side from the low frequency side toward the higher frequency side in k-space, the third MR signal train being acquired after acquiring the second MR signal train, the third MR signal train being acquired by a sequential acquisition which acquires the third MR signal train in one direction in k-space.

5. The magnetic resonance imaging apparatus of claim 1, said at least one processor being further configured to:
change a constant data acquisition order of a first pulse sequence, add sampling points to a low frequency side of k-space in a non-sampling region of the first pulse sequence, and set or present a second pulse sequence for acquiring MR signals, the second pulse sequence being generated based on the first pulse sequence by changing the constant data acquisition order and adding sampling points, the first pulse sequence being for a data acquisition from another sampling region where sampling points in a low frequency side of k-space are fewer than sampling points in the sampling region.

6. The magnetic resonance imaging apparatus of claim 5, wherein said at least one processor is configured to generate the second pulse sequence by changing a part of the sampling region of the first pulse sequence into a non-sampling region, the part of the sampling region being in a high frequency side in k-space.

7. The magnetic resonance imaging apparatus of claim 1, wherein said at least one processor is configured to perform a sequential acquisition as a data acquisition in the first data acquisition order and perform a centric acquisition as a data acquisition in the second data acquisition.

8. The magnetic resonance imaging apparatus of claim 1, wherein said at least one processor is configured to acquire MR signals from a sampling region larger than a sampling region for a case where the MR signals required for generating the MRI data by the data processing were acquired by a sequential acquisition.

9. The magnetic resonance imaging apparatus of claim 1, wherein said at least one processor is configured to acquire MR signals from a sampling region derived by adding sampling points of MR signals by a centric acquisition to a low frequency side of a non-sampling region in k-space for a case where the MR signals required for generating the MRI data by the data processing were acquired by a sequential acquisition.

10. The magnetic resonance imaging apparatus of claim 1, wherein said at least one processor is configured to acquire MR signals with an echo time not more than four times an echo train space.

11. The magnetic resonance imaging apparatus of claim 1, wherein said at least one processor is configured to generate the MRI data by data processing including a phase correction.

12. A magnetic resonance imaging (MRI) method comprising:
using an MRI system to effect acquiring magnetic resonance (MR) signals from an object for a diagnostic MR image in different first and second data acquisition time orders, the MR signals corresponding to a sampling region asymmetric in a phase encoding direction in k-space, said different first and second data acquisition time orders each being one of (a) sequential, (b) centric, (c) inverse, and (d) scroll data acquisition time orders; and generating MRI data by data processing including image reconstruction processing based on the acquired MR signals and generated data filled into a non-sampled region of k-space using a phase conjugate symmetry.

* * * * *